US011823967B2

(12) United States Patent
Bellman et al.

(10) Patent No.: US 11,823,967 B2
(45) Date of Patent: Nov. 21, 2023

(54) RECYCLED GLASS AND GLASS-CERAMIC CARRIER SUSTRATES

(71) Applicant: CORNING INCORPORATED, Corning, NY (US)

(72) Inventors: Robert Alan Bellman, Ithaca, NY (US); Indrajit Dutta, Horseheads, NY (US); Yi-Cheng Hsieh, Horseheads, NY (US); Toshihiko Ono, Corning, NY (US); Nicholas James Smith, Port Matilda, PA (US)

(73) Assignee: CORNING INCORPORATED, Corning, NY (US)

( * ) Notice: Subject to any disclaimer, the term of this patent is extended or adjusted under 35 U.S.C. 154(b) by 220 days.

(21) Appl. No.: 17/100,102

(22) Filed: Nov. 20, 2020

(65) Prior Publication Data

US 2021/0159134 A1  May 27, 2021

Related U.S. Application Data

(60) Provisional application No. 62/938,446, filed on Nov. 21, 2019.

(51) Int. Cl.
*H01L 23/15* (2006.01)
*H01L 23/00* (2006.01)
(Continued)

(52) U.S. Cl.
CPC ............. *H01L 23/15* (2013.01); *C03C 15/00* (2013.01); *C03C 21/002* (2013.01);
(Continued)

(58) Field of Classification Search
CPC ................. H01L 23/15; H01L 23/562; Y10T 428/24364; Y10T 428/24479
See application file for complete search history.

(56) References Cited

U.S. PATENT DOCUMENTS 5,294,238 A * 3/1994 Fukada ............... C03C 17/3435
65/95
6,547,647 B2   4/2003 Chang
(Continued)

FOREIGN PATENT DOCUMENTS

CN   107108333 A   8/2017
WO   2014/181855 A1   11/2014
(Continued)

OTHER PUBLICATIONS

International Search Report and Written Opinion of the International Searching Authority; PCT/US2020/061222; dated Mar. 11, 2021, 13 pages; European Patent Office.
(Continued)

*Primary Examiner* — David Sample
*Assistant Examiner* — Donald M Flores, Jr.
(74) *Attorney, Agent, or Firm* — Yiqun Zhao (57) ABSTRACT

A glass or glass-ceramic carrier substrate, the substrate having undergone at least one complete cycle of a semiconductor fabrication process and having also undergone a reclamation process following the end of the semiconductor fabrication process; the glass or glass-ceramic carrier substrate comprising at least one of the following properties: (i) a coefficient of thermal expansion of less than 13 ppm/° C.; (ii) a Young's Modulus of 70 GPa to 150 GPa; (iii) an IR transmission of greater than 80% at a wavelength of 1064 nm; (iv) a UV transmission of greater than 20% at a wavelength of 255 nm to 360 nm; (v) a thickness tolerance within the same range as the thickness tolerance of the carrier substrate before undergoing at least one complete cycle of the semiconductor fabrication process; (vi) a total thickness variation of less than 2.5 μm; (vii) a failure strength of greater than 80 MPa using a 4-point-bending test; (viii) a pre-shape of 50 μm to 300 μm.

15 Claims, 2 Drawing Sheets

(51) Int. Cl.
*C03C 15/00* (2006.01)
*C03C 23/00* (2006.01)
*C03C 21/00* (2006.01)

(52) U.S. Cl.
CPC ........ *C03C 23/0075* (2013.01); *H01L 23/562* (2013.01); *Y10T 428/24364* (2015.01); *Y10T 428/24479* (2015.01)

(56) References Cited

U.S. PATENT DOCUMENTS

| | | |
|---|---|---|
| 6,845,635 B2 | 1/2005 | Watanabe et al. |
| 7,461,564 B2 | 12/2008 | Glaesemann |
| 9,315,412 B2 | 4/2016 | Cavuoti et al. |
| 9,895,871 B2 | 2/2018 | Shih et al. |
| 10,155,689 B2 | 12/2018 | Gross |
| 2008/0041833 A1 | 2/2008 | Cavallaro et al. |
| 2009/0197048 A1 | 8/2009 | Amin et al. |
| 2010/0047521 A1* | 2/2010 | Amin ............... C03C 3/093 428/141 |
| 2014/0220309 A1 | 8/2014 | Vogt et al. |
| 2018/0005847 A1 | 1/2018 | Fagan et al. |
| 2018/0339932 A1 | 11/2018 | Qian et al. |

FOREIGN PATENT DOCUMENTS

| | | | |
|---|---|---|---|
| WO | 2015/157202 A1 | 10/2015 | |
| WO | WO-2015157202 A1 * | 10/2015 | ............. B32B 17/00 |
| WO | 2018/199059 A1 | 11/2018 | |

OTHER PUBLICATIONS

Hermanowski, J. Thin wafer handling—Study of temporary wafer bonding materials and processes. in 2009 IEEE International Conference on 3D System Integration. 2009.

* cited by examiner

RECYCLED GLASS AND GLASS-CERAMIC CARRIER SUSTRATES

This application claims the benefit of priority under 35 U.S.C. § 120 of U.S. Provisional Application Ser. No. 62/938,446 filed on Nov. 21, 2019, the content of which is relied upon and incorporated herein by reference in its entirety

FIELD

The present disclosure relates to recycled glass and glass-ceramic carrier substrates, specifically recycled glass and glass-ceramic carrier substrates for semiconductor applications.

BACKGROUND

Cost reduction is one of the main trends in the Integrated Circuit (IC) manufacturing industry. An emerging trend to reduce costs in the IC manufacturing industry is to recycle carrier wafers several times. It been projected that by 2022 the carrier wafer recycling market will outpace new carrier sales.

Accordingly, the inventors have developed improved recycled glass and glass-ceramic carrier substrates.

SUMMARY

A glass or glass-ceramic carrier substrate, the substrate having undergone at least one complete cycle of a semiconductor fabrication process and having also undergone a reclamation process following the end of the semiconductor fabrication process; the glass or glass-ceramic carrier substrate comprising at least one of the following properties: (i) a coefficient of thermal expansion of less than 13 ppm/° C. at a temperature of 0 degrees Celsius to 300 degrees Celsius; (ii) a Young's Modulus of 70 GPa to 150 GPa; (iii) an IR transmission of greater than 80% at a wavelength of 1064 nm; (iv) a UV transmission of greater than 20% at a wavelength of 255 nm to 360 nm; (v) a thickness tolerance within the same range as the thickness tolerance of the glass or glass-ceramic carrier substrate before undergoing at least one complete cycle of the semiconductor fabrication process; (vi) a total thickness variation of less than 2.5 µm; (vii) a failure strength of greater than 80 MPa using a 4-point-bending test described herein; (viii) a pre-shape of 50 µm to 300 µm.

Additional features and advantages are set forth in the Detailed Description that follows, and in part will be readily apparent to those skilled in the art from the description or recognized by practicing the embodiments as described in the written description and claims hereof, as well as the appended drawings. It is to be understood that both the foregoing general description and the following Detailed Description are merely exemplary and are intended to provide an overview or framework to understand the nature and character of the claims.

BRIEF DESCRIPTION OF THE DRAWINGS

The following is a description of the figures in the accompanying drawings. The figures are not necessarily to scale, and certain features and certain views of the figures may be shown exaggerated in scale or in schematic in the interest of clarity and conciseness.

In the drawings.

DETAILED DESCRIPTION

Embodiments of the present disclosure are described in detail herein with reference to embodiments thereof as illustrated in the accompanying drawings, in which like reference numerals are used to indicate identical or functionally similar elements. References to "one embodiment," "an embodiment," "some embodiments," "in certain embodiments," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The following examples are illustrative, but not limiting, of the present disclosure. Other suitable modifications and adaptations of the variety of conditions and parameters normally encountered in the field, and which would be apparent to those skilled in the art, are within the spirit and scope of the disclosure.

Where a range of numerical values is recited herein, comprising upper and lower values, unless otherwise stated in specific circumstances, the range is intended to include the endpoints thereof, and all integers and fractions within the range. It is not intended that the scope of the claims be limited to the specific values recited when defining a range. Further, when an amount, concentration, or other value or parameter is given as a range, one or more preferred ranges or a list of upper preferable values and lower preferable values, this is to be understood as specifically disclosing all ranges formed from any pair of any upper range limit or preferred value and any lower range limit or preferred value, regardless of whether such pairs are separately disclosed. Finally, when the term "about" is used in describing a value or an end-point of a range, the disclosure should be understood to include the specific value or end-point referred to. When a numerical value or end-point of a range does not recite "about," the numerical value or end-point of a range is intended to include two embodiments: one modified by "about," and one not modified by "about."

As used herein, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art.

As used herein, "comprising" is an open-ended transitional phrase. A list of elements following the transitional phrase "comprising" is a non-exclusive list, such that elements in addition to those specifically recited in the list may also be present.

The term "or," as used herein, is inclusive; more specifically, the phrase "A or B" means "A, B, or both A and B." Exclusive "or" is designated herein by terms such as "either A or B" and "one of A or B," for example.

The indefinite articles "a" and "an" to describe an element or component means that one or at least one of these elements or components is present. Although these articles are conventionally employed to signify that the modified noun is a singular noun, as used herein the articles "a" and "an" also include the plural, unless otherwise stated in specific instances. Similarly, the definite article "the," as used herein, also signifies that the modified noun may be singular or plural, again unless otherwise stated in specific instances.

The term "wherein" is used as an open-ended transitional phrase, to introduce a recitation of a series of characteristics of the structure.

A "carrier substrate" or "carrier wafer" refers to a supporting structure for assisting with handling a thin substrate that is temporary bonded on the carrier substrate. Such thin substrates cannot otherwise be handled, e.g., by automated equipment. A carrier substrate generally does not include any devices and differ from interposers in that they do not include any supporting structures. The carrier substrate of the embodiments described herein may be a glass or glass ceramic material. In some embodiments, the carrier substrate includes but is not limited to a semiconductor wafer, a flat panel display, or a solar panel.

As used herein, the term "pre-shape" refers to an axisymmetric, out-of-plane shape (e.g. dome or bowl shape) present in the wafer, wherein the pre-shape value (in μm) is defined by the vertical height difference between the highest height point on the top surface, and the lowest height point on the bottom surface, of the carrier wafer.

As used herein, total thickness variation is defined to be the difference between a highest thickness (Tmax) elevation and a lowest thickness (Tmin) elevation on the entire surface of an unclamped (free state) substrate.

In some embodiments, a carrier substrate, having undergone at least one complete cycle of a semiconductor fabrication process and having also undergone a reclamation process following the end of the semiconductor fabrication process (hereinafter a recycled carrier substrate) comprises at least one of the following properties: (i) a coefficient of thermal expansion of less than 13 ppm/° C.; (ii) a Young's Modulus of 70 GPa to 150 GPa; (iii) an infrared (IR) transmission of greater than 80% at a wavelength of 1064 nm; (iv) a UV transmission of greater than 20% at a wavelength of 255 nm to 360 nm; (v) a thickness tolerance within the same range as the thickness tolerance of the carrier substrate before undergoing at least one complete cycle of the semiconductor fabrication process; (vi) a total thickness variation of less than 2.5 μm; (vii) a failure strength of greater than 80 MPa using a 4-point-bending test described herein; (viii) a pre-shape of 50 μm to 300 μm.

In some embodiments, the coefficient of thermal expansion of the recycled carrier substrate at 0 degrees Celsius to 300 degrees Celsius is less than 13 ppm/° C. In some embodiments, the coefficient of thermal expansion of the recycled carrier substrate is less than 11 ppm/° C. In some embodiments, the coefficient of thermal expansion of the recycled carrier substrate is less than 9 ppm/° C. In some embodiments, the coefficient of thermal expansion of the recycled carrier substrate is less than 7 ppm/° C. In some embodiments, the coefficient of thermal expansion of the recycled carrier substrate is less than 5 ppm/° C. In some embodiments, the coefficient of thermal expansion of the recycled carrier substrate is less than 3 ppm/° C. In some embodiments, the coefficient of thermal expansion of the recycled carrier substrate is less than 1 ppm/° C.

In some embodiments, the coefficient of thermal expansion of the recycled carrier substrate is 4 ppm/° C. to 12 ppm/° C. In some embodiments, the coefficient of thermal expansion of the recycled carrier substrate is 4 ppm/° C. to 10 ppm/° C. In some embodiments, the coefficient of thermal expansion of the recycled carrier substrate is 4 ppm/° C. to 8 ppm/° C. In some embodiments, the coefficient of thermal expansion of the recycled carrier substrate is 4 ppm/° C. to 6 ppm/° C. In some embodiments, the coefficient of thermal expansion of the recycled carrier substrate is 4 ppm/° C. to 12 ppm/° C. In some embodiments, the coefficient of thermal expansion of the recycled carrier substrate is 6 ppm/° C. to 12 ppm/° C. In some embodiments, the coefficient of thermal expansion of the recycled carrier substrate is 8 ppm/° C. to 12 ppm/° C. In some embodiments, the coefficient of thermal expansion of the recycled carrier substrate is 10 ppm/° C. to 12 ppm/° C.

In some embodiments, the coefficient of thermal expansion of the carrier recycled substrate is 5 ppm/° C. to 10 ppm/° C. In some embodiments, the coefficient of thermal expansion of the recycled carrier substrate is 7 ppm/° C. to 10 ppm/° C. In some embodiments, the coefficient of thermal expansion of the recycled carrier substrate is 9 ppm/° C. to 10 ppm/° C. In some embodiments, the coefficient of thermal expansion of the recycled carrier substrate is 5 ppm/° C. to 8 ppm/° C. In some embodiments, the coefficient of thermal expansion of the recycled carrier substrate is 5 ppm/° C. to 6 ppm/° C.

In some embodiments, the Young's Modulus of the recycled carrier substrate is 80 GPa to 100 GPa. In some embodiments, the Young's Modulus of the recycled carrier substrate is 85 GPa to 100 GPa. In some embodiments, the Young's Modulus of the recycled carrier substrate is 90 GPa to 100 GPa. In some embodiments, the Young's Modulus of the recycled carrier substrate is 95 GPa to 100 GPa. In some embodiments, the Young's Modulus of the recycled carrier substrate is 80 GPa to 95 GPa. In some embodiments, the Young's Modulus of the recycled carrier substrate is 80 GPa to 90 GPa. In some embodiments, the Young's Modulus of the recycled carrier substrate is 80 GPa to 85 GPa.

In some embodiments, the Young's Modulus of the recycled carrier substrate is 70 GPa to 150 GPa. In some embodiments, the Young's Modulus of the recycled carrier substrate is 80 GPa to 150 GPa. In some embodiments, the Young's Modulus of the recycled carrier substrate is 90 GPa to 150 GPa. In some embodiments, the Young's Modulus of the recycled carrier substrate is 100 GPa to 150 GPa. In some embodiments, the Young's Modulus of the recycled carrier substrate is 110 GPa to 150 GPa. In some embodiments, the Young's Modulus of the recycled carrier substrate is 120 GPa to 150 GPa. In some embodiments, the Young's Modulus of the recycled carrier substrate is 130 GPa to 150 GPa. In some embodiments, the Young's Modulus of the recycled carrier substrate is 140 GPa to 150 GPa. In some embodiments, the Young's Modulus of the recycled carrier substrate is 70 GPa to 140 GPa. In some embodiments, the Young's Modulus of the recycled carrier substrate is 70 GPa to 130 GPa. In some embodiments, the Young's Modulus of the recycled carrier substrate is 70 GPa to 120 GPa. In some embodiments, the Young's Modulus of the recycled carrier substrate is 70 GPa to 110 GPa. In some embodiments, the Young's Modulus of the recycled carrier substrate is 70 GPa to 100 GPa. In some embodiments, the Young's Modulus of the recycled carrier substrate is 70 GPa to 90 GPa. In some embodiments, the Young's Modulus of the recycled carrier substrate is 70 GPa to 80 GPa.

The recycled carrier substrate has a thickness tolerance within the same range as the thickness tolerance of the carrier substrate before undergoing at least one complete cycle of the semiconductor fabrication process. In some embodiments, the thickness tolerance of the original thickness of the carrier substrate is ±5 µm. In some embodiments, the thickness tolerance of the original thickness of the carrier substrate is ±10 µm. In some embodiments, the thickness tolerance of the original thickness of the carrier substrate is ±20 µm. In some embodiments, the thickness tolerance of the original thickness of the carrier substrate is ±30 µm. In some embodiments, the thickness tolerance of the original thickness of the carrier substrate is ±40 µm. In some embodiments, the thickness tolerance of the original thickness of the carrier substrate is ±50 µm.

In some embodiments, the total thickness variation of the recycled carrier substrate is less than 10 µm. In some embodiments, the total thickness variation of the recycled carrier substrate is less than 8 µm. In some embodiments, the total thickness variation of the recycled carrier substrate is less than 7 µm. In some embodiments, the total thickness variation of the recycled carrier substrate is less than 6 µm. In some embodiments, the total thickness variation of the recycled carrier substrate is less than 4 µm. In some embodiments, the total thickness variation of the recycled carrier substrate is less than 2.5 µm. In some embodiments, the total thickness variation of the recycled carrier substrate is less than 2 µm. In some embodiments, the total thickness variation of the recycled carrier substrate is less than 1.5 µm. In some embodiments, the total thickness variation of the recycled carrier substrate is less than 1 µm. In some embodiments, the total thickness variation of the recycled carrier substrate is less than 0.5 µm.

Figure 1:
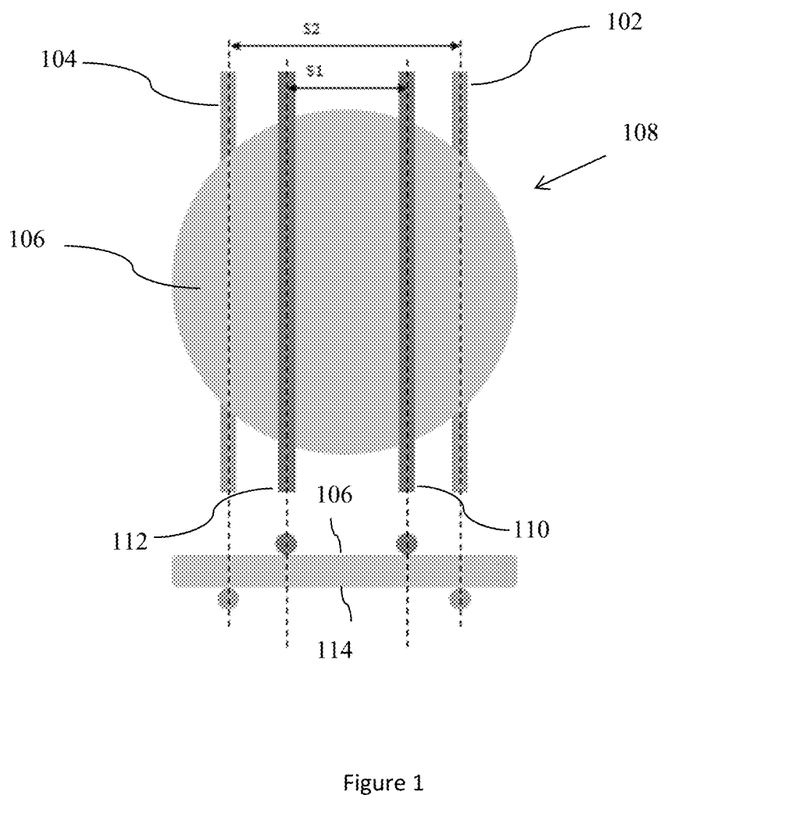
FIG. 1 is a schematic depiction of an exemplary 4-point bending test, according to at least one example.

FIG. 1 depicts an exemplary 4-point bending test used to determine failure strength of the recycled carrier substrate. A recycled carrier substrate 108 (e.g. a 300 mm carrier substrate) is supported on a pair of rollers 102, 104. Another pair of rollers 110, 112 is arranged on top of the recycled carrier substrate 108. The rollers 102, 104, 110, 112 are arranged symmetrically about the centerline of the recycled carrier substrate 108, with the rollers 110, 112 in between the rollers 102, 104. In some embodiments, the rollers 102, 104, 110, 112 are 300 mm. Loads are applied to the top rollers 110, 112 to create two opposing moments on either side of the centerline of the recycled carrier substrate 108. The opposing moments result in constant bending stress in the recycled carrier substrate 108. The applied loads are increased until the carrier substrate 108 fails. The maximum load within the recycled carrier substrate 108 at the time the recycled carrier substrate 108 fails determines the failure strength of the recycled carrier substrate 108. The maximum compressive stress occurs at the top surface 106 where the load is applied, and the maximum tensile stress occurs at the bottom surface 114 just opposite to the load direction. The rollers 110, 112 are placed a distance S1 apart from each other And the rollers 102, 104 are a distance S2 apart from each other. In some embodiments, distance S2 is greater than distance S1. In some embodiments, distance S2 is twice distance S1. The failure stress of the recycled carrier substrate is calculated from the applied load using the following formula:

$$\text{Failure stress}[MPa] = \frac{3 * \text{Load}[N] * \left(\frac{S2 - S1}{2}\right)}{(\textit{Eff. width}) * (\text{Thickness}[m])^2}$$

In some embodiments, S1 is 25 mm, S2 is 50 mm and the effective width of the carrier substrate 108 is 298.6052 mm. In some embodiments, S1 is 100 mm, S2 is 200 mm and the effective width of the carrier substrate 108 is 298.6052 mm. Table 1 depicts the failure stress for two exemplary 4-point bending tests conducted on a recycled carrier substrate having a width of 300 mm (effective width of 298.6052). In the first test, the distance S2 between rollers 102, 104 is 200 mm and the distance S1 between rollers 110, 112 is 100 mm. In the second test, the distance S2 between rollers 102, 104 is 50 mm and the distance S1 between rollers 110, 112 is 25 mm.

TABLE 1

| | Span 100 mm/200 mm | | | Span 25 mm/50 mm | |
|---|---|---|---|---|---|
| | | Failure stress calculated by | | | Failure stress calculated by |
| Failure Load (N) | Width(300 mm) (MPa) | Effective Width (298.6052 mm) (MPa) | Failure Load (N) | Width(300 mm) (MPa) | Effective Width (298.6052 mm) (MPa) |
| 100 | 50 | 54.35 | 432.77 | 54.10 | 54.35 |
| 110 | 55 | 59.78 | 476.05 | 59.51 | 59.78 |
| 120 | 60 | 65.22 | 519.33 | 64.92 | 65.22 |
| 130 | 65 | 70.65 | 562.61 | 70.33 | 70.65 |
| 140 | 70 | 76.09 | 605.88 | 75.74 | 76.09 |
| 150 | 75 | 81.52 | 649.16 | 81.15 | 81.52 |
| 160 | 80 | 86.96 | 692.44 | 86.55 | 86.96 |
| 170 | 85 | 92.39 | 735.72 | 91.96 | 92.39 |
| 180 | 90 | 97.83 | 778.99 | 97.37 | 97.83 |
| 190 | 95 | 103.26 | 822.27 | 102.78 | 103.26 |
| 200 | 100 | 108.70 | 865.55 | 108.19 | 108.70 |
| 203.34 | 101.67 | 110.51 | 880.00 | 110.00 | 110.51 |
| 210 | 105 | 114.13 | 908.82 | 113.60 | 114.13 |
| 220 | 110 | 119.57 | 952.10 | 119.01 | 119.57 |
| 230 | 115 | 125.00 | 995.38 | 124.42 | 125.00 |

In some embodiments, the failure strength of the recycled carrier substrate is greater than 80 MPa. In some embodiments, the failure strength of the recycled carrier substrate is greater than 90 MPa. In some embodiments, the failure strength of the recycled carrier substrate is greater than 100

MPa. In some embodiments, the failure strength of the recycled carrier substrate is greater than 125 MPa. In some embodiments, the failure strength of the recycled carrier substrate is greater than 150 MPa. In some embodiments, the failure strength of the recycled carrier substrate is greater than 175 MPa. In some embodiments, the failure strength of the recycled carrier substrate is greater than 200 MPa. In some embodiments, the failure strength of the recycled carrier substrate is greater than 250 MPa.

In some embodiments, the pre-shape of the recycled carrier substrate is 50 µm to 300 µm. In some embodiments, the pre-shape of the recycled carrier substrate is 100 µm to 300 µm. In some embodiments, the pre-shape of the recycled carrier substrate is 150 µm to 300 µm. In some embodiments, the pre-shape of the recycled carrier substrate is 200 µm to 300 µm. In some embodiments, the pre-shape of the recycled carrier substrate is 250 µm to 300 µm.

Prior to the reclamation process, the carrier substrate undergoes semiconductor fabrication processing that is well-known in the semiconductor fabrication industry. Such semiconductor fabrication processing includes but is not limited to: thermochemical stressing, debonding processes (e.g. laser debonding, thermal debonding, solution debonding, or thermochemical debonding), and exposure to process temperatures of not more than 350 degrees Celsius, or a combination thereof.

Following the semiconductor fabrication processing, the carrier substrate contains flaws (e.g., cracks, chips, etc.) of various shapes, sizes, and dimensions that are induced by the semiconductor fabrication processing. Such flaws reduce the strength of the carrier substrate and can lead to crack generation. Accordingly, subsequent to undergoing semiconductor fabrication processing, the carrier substrate undergoes a reclamation (or recycling) process to mitigate and/or remove contamination and defects from the carrier substrate, thereby enabling the recycled carrier substrate to be re-used in semiconductor fabrication processing instead of being discarded. In some embodiments, the reclamation process is suitable for producing a recycled carrier substrate comprising at least one of the properties in (i)-(viii) described above. In some embodiments, the reclamation process is suitable for producing a recycled carrier substrate comprising at least two of the properties in (i)-(viii) described above. In some embodiments, the reclamation process is suitable for producing a recycled carrier substrate comprising at least three of the properties in (i)-(viii) described above. In some embodiments, the reclamation process is suitable for producing a recycled carrier substrate comprising at least four of the properties in (i)-(viii) described above. In some embodiments, the reclamation process is suitable for producing a recycled carrier substrate comprising at least five of the properties in (i)-(viii) described above. In some embodiments, the reclamation process is suitable for producing a recycled carrier substrate comprising at least six of the properties in (i)-(viii) described above. In some embodiments, the reclamation process is suitable for producing a recycled carrier substrate comprising at least seven of the properties in (i)-(viii) described above. In some embodiments, the reclamation process is suitable for producing a recycled carrier substrate comprising at least eight of the properties in (i)-(viii) described above. In some embodiments, the reclamation process is suitable for producing a recycled carrier substrate comprising all of the properties in (i)-(viii) described above.

In some embodiments, reclamation processing includes but is not limited to: (a) cleaning the edge and/or surface of the carrier substrate, (b) strengthening the surface and/or edge of the carrier substrate, and/or (c) protecting the surface and/or edge of the carrier substrate. The "edge" of a carrier substrate refers to the circumferential edge or perimeter (the carrier substrate can be of any shape and is not necessarily circular) of the carrier substrate. The edge may include one of or any combination of straight edge portions, curved edge portions, beveled edge portions, rough edge portions, notched edge portions, and sharp edge portions.

Figure 2:
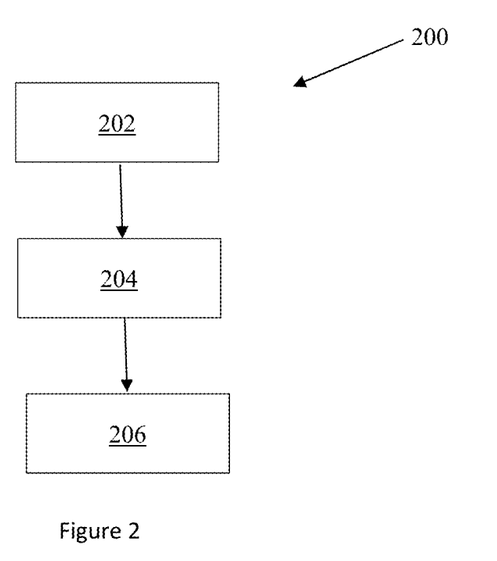
FIG. 2 is a flowchart of a method of recycling a carrier substrate according to at least one example.

The substrate carrier may undergo the above reclamation processing steps in any order with each step performed at least once. For example, in some embodiments, the method 200 of recycling a carrier substrate, having undergone at least one complete cycle of a semiconductor fabrication process, includes at step 202 cleaning at least one of an edge and a surface of the carrier substrate as described below. At step 204, the surface and/or edge of the cleaned carrier substrate is strengthening using the processes identified below. At step 206, the surface and/or edge of the strengthened carrier substrate is protected using the using the processes identified below. The method 200 is not intended to be limiting and can be modified to achieve the properties (i)-(viii) of the recycled carrier substrate identified herein. For example, in some embodiments, the carrier substrate may be cleaned, strengthened and cleaned again without undergoing a protection step.

In some embodiments, an edge or surface of the carrier substrate may be cleaned by any suitable mechanical and/or chemical cleaning methods used in the industry including but not limited to ultrasonics, megasonics, sprays, brushes, UV, UV-ozone, plasmas, and detergents. The types of detergent vary and may include such commercial products as Semiclean KG, Parker 225×, or the like. These detergents may be bases or acids, and may include chelators, surfactants, and other proprietary (and therefore unknown) components. The cleaning process may include reducing or completely removing various types of contaminants on or at the surface of the carrier substrate such as glass particles, metallic contamination, organic contamination, etc. Cleaning of the edge of the carrier substrate may include cleaning a portion of the edge or of the entire edge of the article. Cleaning of the surface of the article may include cleaning a portion of the surface or of the entire surface of the article.

In some embodiments, the carrier substrate may undergo treatments to strengthen the surface and/or edge of the substrate which include but are not limited to: hydrofluoric acid, hydrogen fluoride (HF) acid etching of the carrier substrate, application of residual compressive stress to the carrier substrate, HF-vapor exposure of the carrier substrate, base-pH liquid immersion of the carrier substrate, IOX/Reverse-IOX of the carrier substrate. The carrier substrate has a first edge strength at the beginning of the strengthening process and a second edge strength at the end of the strengthening process. In one or more embodiments, the second edge strength at the end of the strengthening process is much greater than the first edge strength at the beginning of the strengthening process. For example, a second edge strength may be up to 2, 3, 4, or 5 times the first edge strength. A second edge strength greater than 5 times the first edge strength may also be possible.

The strength of the carrier substrate can be increased by altering the geometry, or decreasing the size or dimensions, of flaws that are present in the carrier substrate. The energy required to propagate a flaw or crack is proportional to the radius of the crack tip and the reverse proportional to the depth of the crack. The strength of the carrier substrate is increased by reducing the dimensions and number of flaws. In one embodiment, the number of flaws is reduced by etching the carrier substrate with an etchant. The etchant, in some embodiments, comprises hydrogen fluoride or a mixture of hydrogen fluoride and at least one acid. The acid etches away microflaws and rounds out larger flaws, thus increasing the energy required to initiate and/or propagate a crack. In other embodiments, the carrier substrate can be etched using other techniques known in the art, such as etching with a reactive gas or plasma etching. In some embodiments, the edge and/or surface of the carrier substrate is HF-acid-etching to improve strength by partially dissolving the carrier substrate surface and either removing or blunting flaws, without compromising the thickness requirement of the substrate. Removal of material from the carrier substrate during the etch process is <1 um to maintain adherence to total thickness specification.

In some embodiments, a compressive stress is generated at the edge and/or surface of the carrier substrate via thermal processes, such as laser polishing or by ion exchange. Ion exchange (IOX) processes are employed to vary and control the concentration of metal ions in various glass, glass-ceramic and ceramic substrates through localized compositional modifications. These compositional modifications in the substrates can be used to modify certain substrate properties. For example, alkali metal ions (e.g., Na and K ions) may be imparted into surface regions of substrates as a strengthening mechanism. These IOX processes often involve the immersion of substrates in a molten salt bath at elevated temperatures. The molten salt bath includes metal ions intended to be introduced into the substrates. Ions in the substrates are exchanged with the metal ions in the bath during the IOX processes. The concentration levels of metal ions in the bath can change over time as metal ions in the bath are consumed and replaced by ions exchanged from the substrate. At some point in time, the concentration of the metal ions in the bath falls below a practical level for imparting the desired property in the substrate through the IOX process requiring a fresh ion exchange bath for each substrate.

In some embodiments, surface and edge strengthening by HF-vapor exposure exposes batches of substrates to HF vapors under controlled conditions. Such treatment advantageously facilitates high process efficiency, reduced cost, access to all surfaces (A- and B-sides) and edge of the carrier substrate simultaneously, and inherently low overall material removal, thereby enabling adherence to total thickness specification and advantageous mixtures of HF vapors with other gaseous species, such as with water vapor and/or alcohol vapors to catalyze the glass-etching reaction, and/or vapor species designed to create gas-phase reaction products with components from the glass.

In some embodiments, surface and edge strengthening is achieved by immersing batches of substrates in base-pH liquid under controlled conditions, at specific temperature, for a specific time, to achieve a desired etch rate and degree of material removal to effectuate the needed level of strengthening. Such treatment advantageously facilitates high process efficiency, reduced cost, access to all surfaces (A- and B-sides) and edge simultaneously, low overall material removal during treatment enabling adherence to total thickness specification, and minimal surface roughening.

In some embodiments, damage introduction on wafer carriers are not only scratches, but also indentation damage. A typical source of such indentation damage is a protrusion/particle a few microns in size. In some embodiments, carrier substrate treatments to protect the surface of the carrier substrate from such damage include but are not limited to: application of a hard coating, application of a lubricious coating, and/or flaw-filling. In some embodiments, surface protection by hard coating must therefore be of sufficient hardness/thickness to resist damage under these contact loads. In some embodiments, surfaces can thus be protected from damage introduction by depositing a thin, transparent, high hardness film, preferably a film with compressive stress in it. Exemplary coatings include but are not limited to $SiN_x$, AlON, SiAlON, diamond-like carbon, or SiC. In some embodiments, the coating may be advantageously applied only on the B-side (i.e. the side with the greatest wafer handling damage). In some embodiments, the coatings may be removed and re-applied during the reclamation process. In some embodiments, the hard coating process is typically a physical vapor deposition process such as sputtering, ion beam sputtering, or ion assisted deposition, or a chemical vapor deposition process such as plasma enhanced chemical vapor deposition. In some embodiments, hard inorganic coatings have the advantage of surviving semiconductor process temperatures and can also be durable for the chemical solutions used in semiconductor processing. In some embodiments, the coatings are optically transparent, especially at UV wavelengths for delamination process. In some embodiments, the coatings have a coating thickness that is optically and dimensionally uniform. In some embodiments, the coating materials includes epoxy series as mold material, or Poly-Imide series, which have the potential to be a thick coating on the substrate backside to prevent indentation and scratch type damages In some embodiments, damage introduction can be reduced by depositing an appropriate lubricious coating on the wafer B-side to reduce the coefficient of friction (COF). In some embodiments, typical lubricious coating materials are layered structure materials such as: low-surface-energy covalent materials such as diamond-like carbon and boron nitride, organic or organometallic materials such as silicones and fluoropolymers, other materials such as $MoS_2$, Graphite, PTFE, $WS_2$, and $BN_x$. In some embodiments, the lubricious coating materials are non-layered structure materials such as $CaF$, $SiO_2$, fullerene, and carbon nanotube. In some embodiments, the lubricious coating materials can be coated as mixture with binder and solvent.

In some embodiments, failure from introduced damage on handled wafers can be prevented by filling the introduced damage with an organic, inorganic, or organometallic material. In some embodiments, this method can be combined with the hard coating or COF reducing methods described above. In some embodiments, a suitable method for strengthening by flaw-filling is use of atomic-layer deposition (ALD), which has been shown to be able to fill nanoscopic flaws through conformal atomic-layer-by-layer coating deposition. This method also has the advantage of conformally depositing on all surfaces and edges simultaneously, as well as ability to batch process multiple wafers simultaneously (no line of sight needed).

In some embodiments, reclamation processing can further include a proof-testing step after semiconductor fabrication processing and prior to the treatment steps discussed above. In some embodiments, this test is used to screen out badly-damaged and/or poorly-handled wafers prior to the treatment steps. In some embodiments, a proof-stress is designed based on knowledge of the glass' CTE and is used to target a specific temperature difference ($\Delta T$) during thermal shock testing of the carrier substrate. In some embodiments, a proof-stress comprises: batches of wafers loaded into a carrier and heated to a desired temperature, the wafers are then dunked rapidly in a non-aqueous liquid medium. In some embodiments, the advantages of using a rapidly-applied thermal stress with a non-aqueous medium is to mitigate or effectively eliminate sub-critical crack growth, or so-called static fatigue, which can weaken glass during stress application. In some embodiments, use of a non-aqueous liquid medium reduces or effectively eliminates exposure to water and avoids sub-critical crack growth. In some embodiments, a suitable liquid medium includes but is not limited to: liquid nitrogen or a high-flash-point organic solvents (e.g. perflouropolyethers, fluorinert, etc.). In some embodiments, the impact of sub-critical crack growth on strength is also dependent on the duration of the load. In some embodiments, rapidly-applied stresses, such as during thermal shock helps to mitigate sub-critical crack growth. A thermal shock test also has the advantages of applying designed-stress equally to all surfaces and edges, both A-side and B-side, stresses all flaw orientations, and can be done quickly and efficiently in a batch process.

It will be apparent to those skilled in the art that various modifications to the preferred embodiments of the disclosure as described herein can be made without departing from the spirit or scope of the disclosure as defined in the appended claims. Thus, the disclosure covers the modifications and variations provided they come within the scope of the appended claims and the equivalents thereto.

What is claimed is:

1. A glass or glass-ceramic carrier substrate, the carrier substrate having undergone at least one complete cycle of a semiconductor fabrication process and having also undergone a reclamation process following the end of the semiconductor fabrication process, the reclamation process including strengthening the glass or glass-ceramic carrier substrate; the glass or glass-ceramic carrier substrate comprising the following properties:
   a thickness tolerance of an original thickness of the carrier substrate is ±50 µm;
   a total thickness variation of less than 2.5 µm; and
   a failure strength of greater than 80 MPa according to a 4-point bending protocol test, and
   wherein the glass or glass-ceramic carrier substrate includes at least one of the following properties:
   (i) a coefficient of thermal expansion of less than 13 ppm/° C. at a temperature of 0 degrees Celsius to 300 degrees Celsius;
   (ii) a Young's Modulus of 70 GPa to 150 GPa;
   (iii) an IR transmission of greater than 80% at a wavelength of 1064 nm;
   (iv) a UV transmission of greater than 20% at a wavelength of 255 nm to 360 nm; and
   (v) a pre-shape of 50 µm to 300 µm.

2. The carrier substrate of claim 1, wherein the carrier substrate is a semiconductor wafer, a flat panel display, or a solar panel.

3. The carrier substrate of claim 1, wherein the carrier substrate comprises one or more surfaces with a protective coating.

4. The carrier substrate of claim 1, wherein the coefficient of thermal expansion of the carrier substrate is 4 ppm ° C. to 12 ppm/° C.

5. The carrier substrate of claim 1, wherein the coefficient of thermal expansion of the carrier substrate is less than 11 ppm/° C.

6. The carrier substrate of claim 1, wherein the coefficient of thermal expansion of the carrier substrate is 5 ppm/° C. to 10 ppm/° C.

7. The carrier substrate of claim 1, wherein the Young's Modulus of the carrier substrate is 80 GPa to 100 GPa.

8. The carrier substrate of claim 1, wherein the Young's Modulus of the carrier substrate is 90 GPa to 150 GPa.

9. The carrier substrate of claim 1, wherein the thickness tolerance of the original thickness of the carrier substrate is ±5 µm.

10. The carrier substrate of claim 9, wherein the total thickness variation of the carrier substrate is less than 2 µm.

11. The carrier substrate of claim 9, wherein the total thickness variation of the carrier substrate is less than 1 µm.

12. The carrier substrate of claim 1, wherein the carrier substrate comprises at least two of the properties (i)-(v).

13. The carrier substrate of claim 1, wherein the carrier substrate comprises at least three of the properties (i)-(v).

14. The carrier substrate of claim 1, wherein the carrier substrate comprises at least four of the properties (i)-(v).

15. The carrier substrate of claim 1, wherein the carrier substrate comprises all the properties (i)-(v).

* * * * *

UNITED STATES PATENT AND TRADEMARK OFFICE
CERTIFICATE OF CORRECTION

| | |
|---|---|
| PATENT NO. | : 11,823,967 B2 |
| APPLICATION NO. | : 17/100102 |
| DATED | : November 21, 2023 |
| INVENTOR(S) | : Robert Alan Bellman et al. |

It is certified that error appears in the above-identified patent and that said Letters Patent is hereby corrected as shown below:

On the Title Page

Item (54), in Column 1, in "Title", Line 2, delete "SUSTRATES" and insert -- SUBSTRATES --.

In the Specification

In Column 1, Line 2, delete "SUSTRATES" and insert -- SUBSTRATES --.

In the Claims

In Column 12, Line 15, in Claim 4, delete "ppm ° C." and insert -- ppm/° C. --.

Signed and Sealed this
Thirtieth Day of April, 2024

Katherine Kelly Vidal
*Director of the United States Patent and Trademark Office*